United States Patent [19]

Kobayashi

[11] Patent Number: 5,280,567

[45] Date of Patent: Jan. 18, 1994

[54] DIGITAL DISPLAY DEVICE FOR DISPLAYING MEASURING DATA

[75] Inventor: Hiroyuki Kobayashi, Mitaka, Japan

[73] Assignee: Tokyo Seimitsu Co., Ltd., Tokyo, Japan

[21] Appl. No.: 565,930

[22] Filed: Aug. 13, 1990

[30] Foreign Application Priority Data

Jul. 2, 1990 [JP] Japan ................. 2-174936

[51] Int. Cl.⁵ ............................. G06F 15/62
[52] U.S. Cl. ......................... 395/118; 395/133; 395/139; 395/155; 395/161
[58] Field of Search ............ 395/111–112, 114, 118, 125, 126, 129, 133, 139, 155, 161

[56] References Cited

U.S. PATENT DOCUMENTS

| | | | |
|---|---|---|---|
| 4,149,165 | 4/1979 | Herman et al. | 395/114 X |
| 4,591,998 | 5/1986 | Kuperman et al. | 395/118 |
| 4,695,976 | 9/1987 | Nakanishi et al. | 395/112 |
| 4,730,262 | 3/1988 | Watanabe et al. | 395/140 |

Primary Examiner—Gary V. Harkcom
Assistant Examiner—Almis Jankus
Attorney, Agent, or Firm—Oliff & Berridge

[57] ABSTRACT

A dimension display device displays the dimension of a machined member to be measured by means of a bar graph. The dimension display device includes a bar graph display part which is composed of a large number of display elements, and a plurality of scale display parts disposed in parallel to the bar graph display part for displaying in a numeric value a scale with respect to the bar graph display part. The plurality of scale display parts are able to shift the numeric value of the scale for display according to different types of members to be measured. That is, if the center value of the tolerance of the member to be measured is set, then the scale display parts shift the numeric value of the scale such that the center value of the tolerance is moved to the center of the bar graph display part, so that the bar graph display part can be used effectively.

5 Claims, 10 Drawing Sheets

DIGITAL DISPLAY DEVICE FOR DISPLAYING MEASURING DATA

BACKGROUND OF THE INVENTION

1. Field of the Invention

The present invention relates to a dimension display device and, in particular, to a dimension display device which displays on a column gage (which is also referred to as a bar graph gage) whether the dimension of a work machined is within a tolerance set by a design dimension (a difference between the allowable maximum and minimum values of the design dimension).

2. Description of the Related Art

Figure 11:
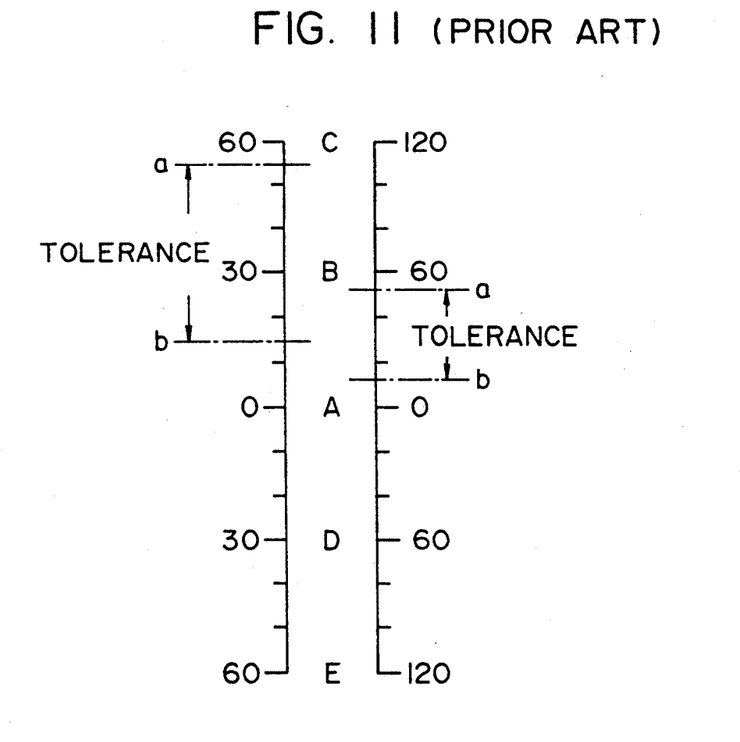

In a bar graph gage according to the prior art, the zero point of the scale thereof is always fixed and displayed in the center of the bar graph and thus, it cannot be moved to any other points. In the prior art bar graph gage, when the values of the tolerances of a member to be measured exist above and below with the zero point as a center, for example, when the values of the tolerances are ±a, no problem arises because the tolerances can be displayed equally above and below the zero point of the scale with such zero point as a center. However, the actual values of the tolerances are not always equal plus and minus values relative to the design dimension. That is, they are not always ±a. In other words, the tolerance values a, b with respect to the design dimension, in most cases, are different from each other. For example, according to the JIS(Japanese Industrial Standard), in the G7 standard of a hole of 130 mm, one tolerance a thereof is equal to +0.054 and the other tolerance b thereof is equal to +0.014. In FIG. 11, there is shown an explanatory view in which such tolerances are displayed on a column gage. In this figure, when the central point A of the scale is zero and the whole length of the column gage is cut into four equal sections to provide four equally-spaced cutting points B, C, D and E. Then the central point A, [0], displays the design dimension (in this embodiment, 130 mm), [30] at the B point displays a distance [0.030 mm] from the A point, and [60] at the C point displays a distance [0.060 mm] from the A point. Numerals shown on the right side of the column gage are provided for display when the resolution of the column gage is switched.

Here, if the above-mentioned tolerance values a, b are applied to the scale in FIG. 11, then in the scale of the column gage shown left in FIG. 11 there is obtained a tolerance range shown by an arrow line in FIG. 11. In the column gage left-side scale of FIG. 11, there is left only a small display range above the upper tolerance value a, while there can be provided a wide display range below the lower tolerance value b. In view of this, in order to make it possible to provide sufficient display in both directions, the resolution of the column gage must be unavoidably lowered as shown in the right-side scale in FIG. 11. However, in such display, the magnification of the display is lowered with the result that it is difficult to see whether the tolerance values are within the allowed tolerance range.

SUMMARY OF THE INVENTION

The present invention aims at eliminating the drawbacks found in the above-mentioned dimension display device.

Accordingly, it is an object of the invention to provide a dimension display device which is capable of setting the center of tolerances in the center of a bar graph display section.

In order to achieve the above object, according to the invention, there is provided a dimension display device which comprises: bar graph display means which comprises a large number of display elements, each of which is controlled in accordance with the dimensional information of a member to be measured; a plurality of scale display means which contain the center position of the bar graph display means, the plurality of scale display means being located respectively at such positions that divide the bar graph display means into sub-sections at fixed intervals, the plurality of scale display means displaying scales on the bar graph display means by numerical displaying values; numerical value data output means which outputs numerical value data so that zero is displayed in the scale display means corresponding to the center position of the bar graph display means, and wherein the display other remaining scale display means display numerical values corresponding to the respective positions of numerical value data; tolerance center value setting means which sets the center value of the allowed tolerance of a member to be measured and also outputs the numerical data that represents such center value; add/subtract means which adds (or subtracts) the respective numerical data output from the numerical data output means to (or from) the numerical data representing the tolerance center value that is output from the tolerance center value setting means; and, scale display control means which controls the plurality of scale display means to output the corresponding numerical values in accordance with the respective numerical data output from the add/subtract means, characterized in that the virtual center of the allowed tolerance can be displayed in the center of the bar graph display means.

According to the present invention, the center value of the tolerance of the member to be measured can be set at the center point of the bar graph display means to thereby provide a display range which extends equally upwardly and downwardly of the center point of the scale of the bar graph display means, resulting in a high resolution display and the display of the entire tolerance range.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

BRIEF DESCRIPTION OF THE INVENTION

Detailed description will hereunder be given of the preferred embodiment of a dimension display device according to the present invention with reference to the accompanying drawings.

Figure 1:
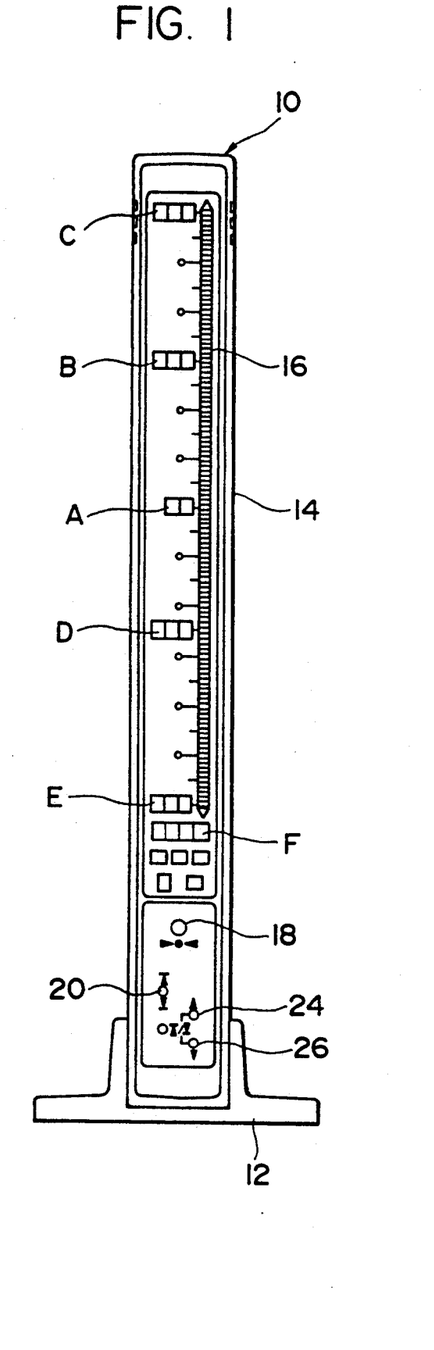
FIG. 1 is a front view of a column gage according to the present invention.
Figure 2:
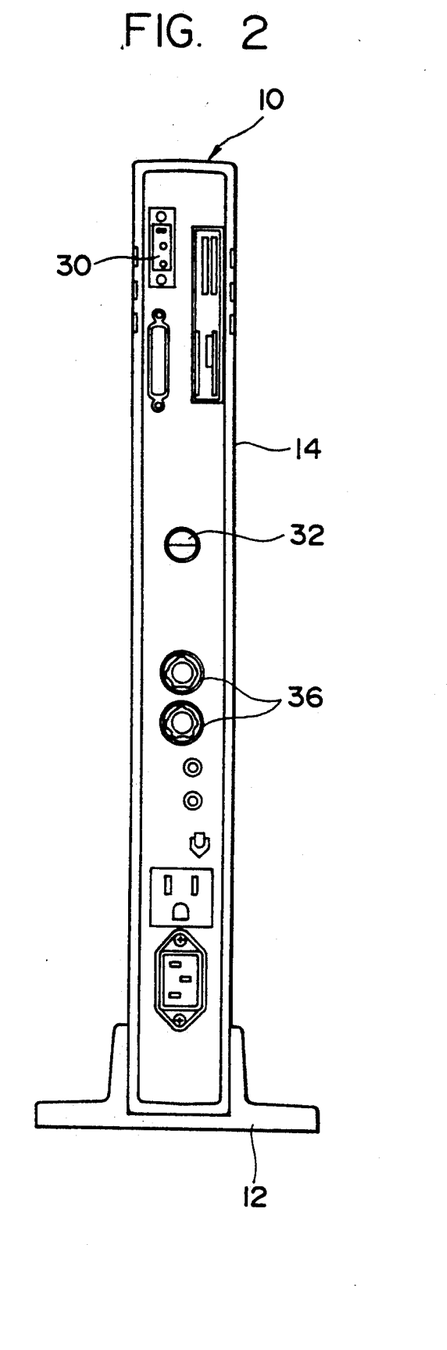
FIG. 2 is a rear view of the column gage shown in FIG. 1.

In FIG. 1, there is shown a front view of a column gage 10 to which the present invention is applied. And, in FIG. 2, there is shown a rear view of the column gage 10. The column gage 10 is composed of a base member 12 and a column member 14 erected on the base member 12. In the front surface of the column member 14, as shown in FIG. 1, there are arranged various display parts and switches. And, in the rear surface of the column member 14, as shown in FIG. 2, there are arranged connectors and switches.

In particular, in the front surface of the column member 14, there is provided a bar graph display part 16 which is composed of a plurality of, for example, 121 pcs. of light emitting diodes (which is hereinafter referred to as LED). Each of the LEDs of the bar graph display part 16 is composed of a two-color light emitting diode. That is, the two-color LED is able to display a red color when the dimension of a member to be measured is out of an allowed tolerance range, namely, for NG, and it is able to display a green color when the dimension of the member to be measured is within the allowed tolerance range, namely, for OK. On the left of the bar graph display part 16 there can be provided a plurality of scale display sections. For example, as shown in FIG. 1, the bar graph display part 16 can be divided into four scale display sections B, C, D and E. In the illustrated embodiment, the scale display sections B and C are disposed above and the scale display sections D and E are disposed below a scale display section A which is situated at the center of the bar graph display part 16. On the scale display sections A, B, C, D and E there are displayed digitally the reference scale figures that are obtained when a tolerance range is set and when a tolerance center is shifted. In the bar graph display part 16, there is further provided a digital display section F which is used to digitally display the measured dimension of a work.

And, in the front surface of the column member 14, there are arranged a zero set switch 18, a tolerance-setting/measuring change-over switch 20, and up switch 24, and a down switch 26.

Also, in the rear surface of the column member 14, there are arranged a range center value setting switch 30, a range change-over switch 32, and a detector connector 36.

Figure 3:
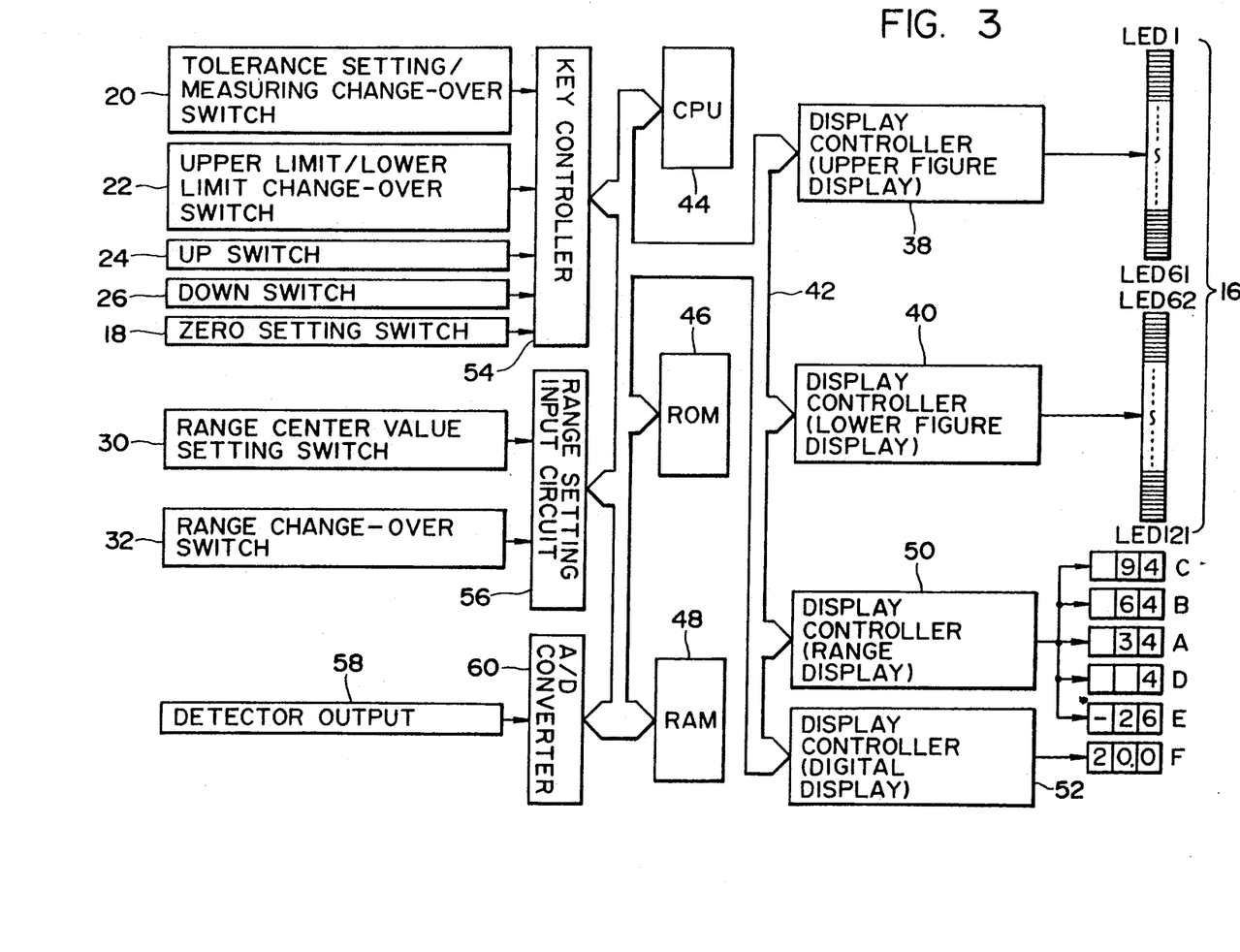
FIG. 3 is a block diagram used to control a column gage according to the present invention.

Referring now to FIG. 3, there is shown a control block diagram of a dimension display device according to the invention. The bar graph display part 16 is connected through display controllers 38 and 40 to a bus line 42 which is connected to CPU 44, ROM 46 and RAM 48. The LEDs 1~61 of the bar graph display part 16 are controlled or turned on and off by the upper display controller 38, while the LEDs 62~121 are controlled or turned on and off by the lower display controller 40. Also, the turning on and off of the scale display sections A~E is controlled by a range display controller 50 and the turning on and off of the digital display section F is controlled by a digital display controller 52.

To a key controller 54 there are connected the tolerance setting/measuring change-over switch 20, upper limit/lower limit change-over switch 22, up switch 24, down switch 26 and zero setting switch 18. If the switches 18~26 are operated by means of tolerance setting, master actual dimension correction and zero setting correction, then the information from the switches 18~26 is coded by the key controller 54 and the coded data is then sent to the CPU 44, which initiates a key process program stored in the ROM 46, so that the data corresponding to the key operations can be stored within the RAM 48.

To a range setting input circuit 56 there are connected the range center value setting switch 30 and range change-over switch 32. If the switches 30 and 32 are operated, then the data from these switches is digitized and the digital data is input through a data bus into the CPU 44 and is then stored in the RAM 48.

A detector 58 is connected through an A/D converter 60 to the bus line 42. The data that is output from the detector 58 is digitized and the digital data is input into the CPU 44 and is then stored in the RAM 48. In the ROM 46 there is contained a measuring program which allows the CPU 44 to obtain various kinds of information stored in the RAM 48 to convert the information into display data. The converted display data is then sent to the display controllers 38, 40, 50 and 52.

In the display controllers 38 and 40, a set tolerance value and a measured value are displayed by the bar graph display part 16. At the same time, in order to display the decision result by means of the colors of the bar graph, the LEDs are turned on to display red or green by opening gates according to the information sent from the CPU 44.

Figure 4:
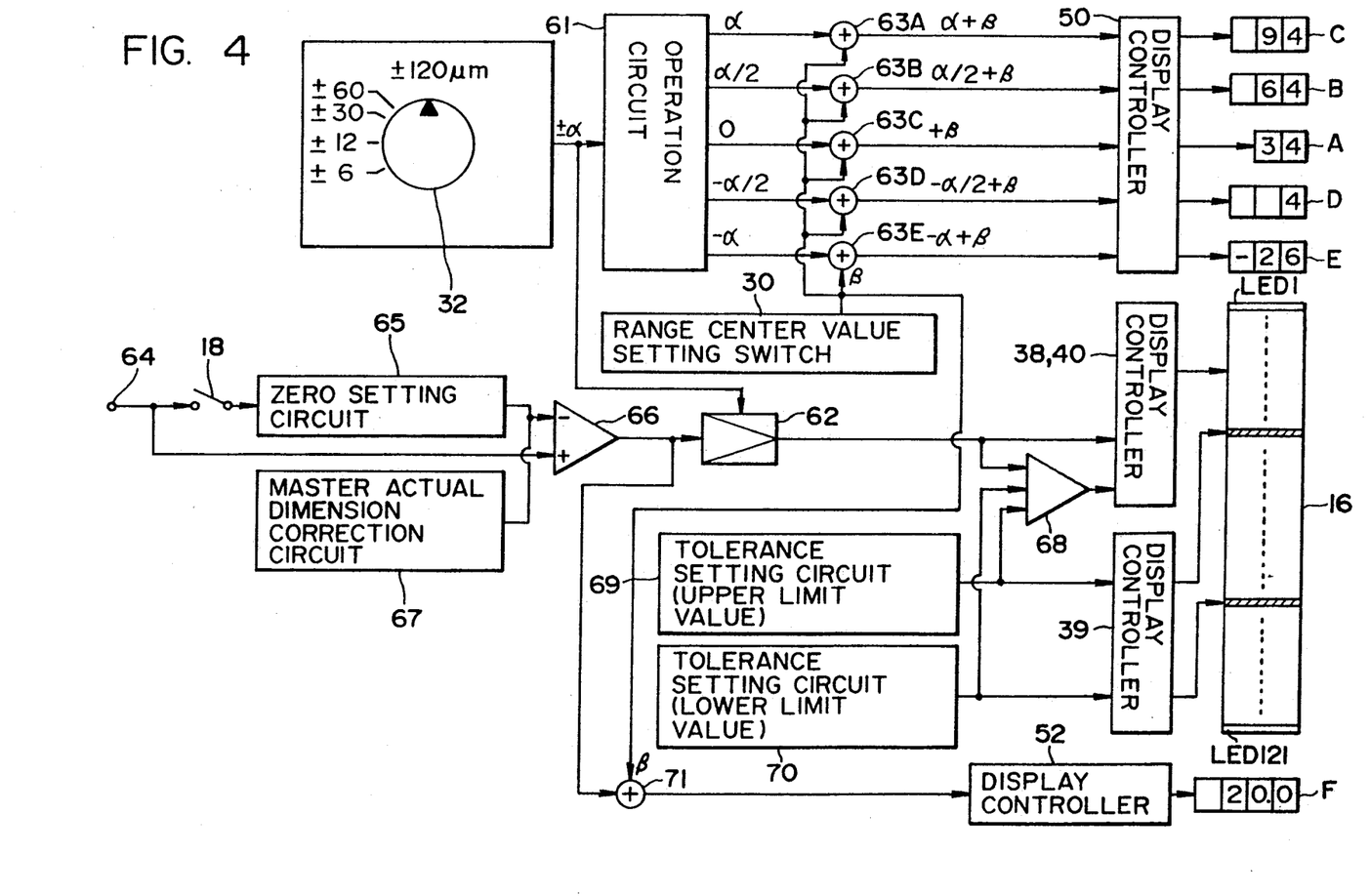
FIG. 4 is a circuit diagram of a column gage according to the present invention.

Now, in FIG. 4, there is shown a block diagram of a dimension display device which is equivalent to that shown in FIG. 3. In this figure, the parts that are common with those in FIG. 3 are designated by the same reference numerals.

In FIG. 4, a range change-over switch 32 applies to operation circuits 61 and 62 a signal which indicates a measurement range ($\pm\alpha$) set by the range change-over switch 32. Here, the range change-over switch 32 is able to selectively switch any one of a plurality of measurements such as $\pm 6$, $\pm 12$, $\pm 30$, $\pm 60$, and $\pm 120$ $\mu m$. Responsive to the input signal, the operation circuit 61 outputs signals indicating $\alpha$, $\alpha/2$, 0, $-\alpha/2$ and $-\alpha$ to adders/subtractors 63A~63E, respectively.

To the other inputs of the respective adders/subtractors 63A~63E, there are applied signals, each of which indicates a range center value $\beta$ set by the range center value setting switch 30. The adders/subtractors 63A~63E add the two inputs and then output to a display controller 50 signals respectively indicating $\alpha+\beta$, $\alpha/2+\beta$, $\beta$, $-\alpha/2+\beta$, and $-\alpha+\beta$.

In accordance with the above-mentioned inputs, the display controller 50 allows the scale display sections C, B, D and F to display numerals indicating $\alpha+\beta$, $\alpha/2+\beta$, $\beta$, $-\alpha/2+\beta$, and $-\alpha+\beta$, respectively. In the respective scale display sections in FIG. 4, there is displayed an example where $\alpha=60$, and $\beta=34$.

On the other hand, the measured value of a member to be measured that is output from the differential transducer or the like of a measuring device is applied through an input terminal 64 to the zero setting switch 18 and operation circuit 66.

The zero setting switch 18 is operated when a master is set. In particular, if the zero setting switch 18 is pushed once while the master is being measured by the measuring device, then the measured value of the master is input to a zero setting circuit 65. The zero setting circuit 65 stores the measured value input thereto and outputs the measured value to the negative input of the operation circuit 66.

A measured value from the measuring device is applied to the positive input of the operation circuit 66. The operation circuit 66 outputs to an operation circuit 62 a signal which indicates a difference between these two inputs. It goes without saying that, if the zero setting switch 18 is pushed once, then the output from the operation circuit 66 becomes zero. Also, a correction value based on the switching operation of a correction switch is applied to the negative input of the operation circuit 66 from a actual master dimension correction circuit 67. This correction will be discussed later.

As described before, the signal indicating the measuring range is applied from the range change-over switch 32 to the other input of the above-mentioned operation circuit 62 and the operation circuit 62 converts the signal input thereto into a signal which is inversely proportional to the magnitude of the measuring range. For example, a signal output from the operation circuit 62 for the measuring range of ±60 μm is double when compared with a signal output from the same circuit for the measuring range of ±120 μm, so that a measuring sensitivity can be improved.

The output of the operation circuit 62 is applied to display controllers 38, 40 as well as to a decision circuit 68. The display controllers 38, 40 are used to control the turning on and off of the LEDs 1~121 of the bar graph display part 16. That is, the controllers turn on all LEDs below the LED that is situated at a position corresponding to the level of the signal input, and thereby displays the measured value by means of a bar graph.

Also, tolerance setting circuits 69 and 70 are respectively used to set upper and lower tolerance limits by means of operation of an up/down switch (which is not shown), and they output to the display controller 39 and decision circuit 68 the signals that indicate the set upper and lower tolerance values, respectively.

In accordance with the signals input thereto, the display controller 39 turns on the red color of the two color LEDs that correspond to the upper and lower tolerance limit values, respectively. Also, the decision circuit 68 decides whether the signal input thereto from the operation circuit 62 is within the ranges of the signals indicating the above-mentioned upper and lower tolerance limit values or not, and outputs a signal indicating the decision result thereof to the display controllers 38 and 40.

As described before, the display controllers 38 and 40 control the turning on and off of all LEDs below the LED situated at a position corresponding to the level of the signal input. In particular, when a signal indicating the in-range is applied thereto from the above-mentioned decision circuit 68, then the display controllers 38 and 40 turns on the green colors of the abovementioned two color LEDs and, when a signal, indicating the out-of range is applied, controllers 38 and 40 turn on the red colors of the two color LEDs. Also, when the display of these LEDs occurs simultaneously with the display of the LEDs indicating the upper and lower tolerance limit values, then the LEDs corresponding to such simultaneous actuations are turned on orange. That is, the LEDs are turned on red and green at the same time thereby displaying an orange color.

Also, the output of the operation circuit 66 and a signal indicating a range center value β set by the above-mentioned range center value setting switch 30 are added by an adder 71, and a signal indicating the added value is output to a display controller 52. In accordance with a signal input thereto, the display controller 52 allows a figure or numeral indicating the measured value to be displayed on the digital display section F.

Next, description will be given below of a manner of using a dimension display device according to the present invention in connection with flow charts shown in FIGS. 5 to 9. At first, a measuring range is selected in Step 74. In particular, when it is necessary to set a measuring range, the measuring range is determined in accordance with the flow of a sub-routine shown in FIG. 6. That is, as described before, it is possible to set a range from ±6 μm~±120 μm. For example, when a tolerance is set in a range of +14~+54 μm, then the smallest range including this tolerance, ±60 μm, is selected in the step 76 of FIG. 6 ( FIG. 10(A)). This range selection is performed by the above-mentioned range changeover switch 32.

Figure 10A:
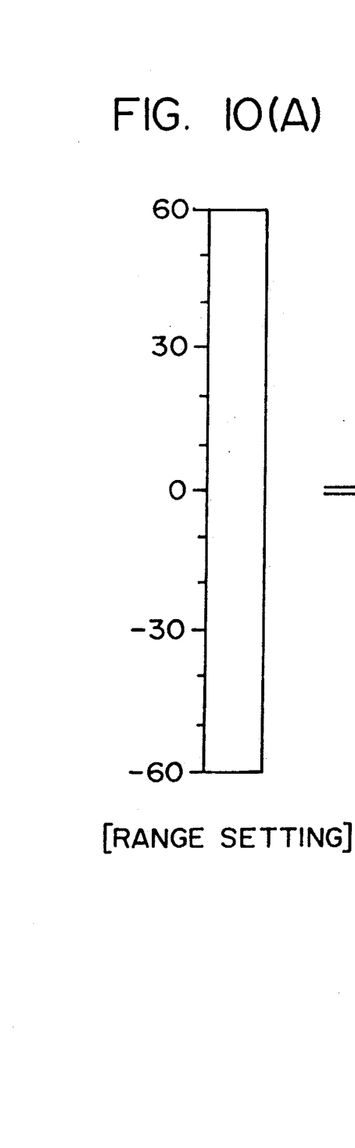
FIGS. 10(A) to (E) are views respectively showing the display contents of a column gage, the display contents being selected by operating associated switches respectively; and, FIG. 11 is an explanatory view of a column gage according to the prior art.
Figure 10B:
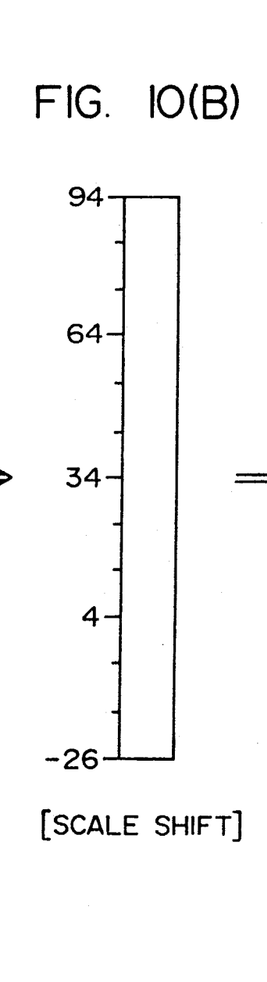

Further, in Step 78, whether it is necessary to move the range center value is checked. That is, it is not necessary to move the range center value when the tolerance values are set evenly with zero as the center thereof, as in the case when the tolerance values are ±a. However, when the tolerance values are set between +14~+54 μm, it is necessary to move the tolerance range center value so that it is set in the center of the display part 16, in Step 80. That is, in this case, due to the fact that the center value of the tolerance is +34 μm, +34 μm is set by means of the range center value setting switch 30. If this setting is carried out, then in Step 82, figures obtained by adding such a tolerance center value to the respective measuring range display figures are displayed respectively in the scale display sections A to E in the left bar graph, respectively, (Step 84). That is, [34] is displayed in A, center of the scale display sections; [64] in B; [94] in C; [4] in D; and, [−26] in E; (FIG. 10(B)).

Figure 7:
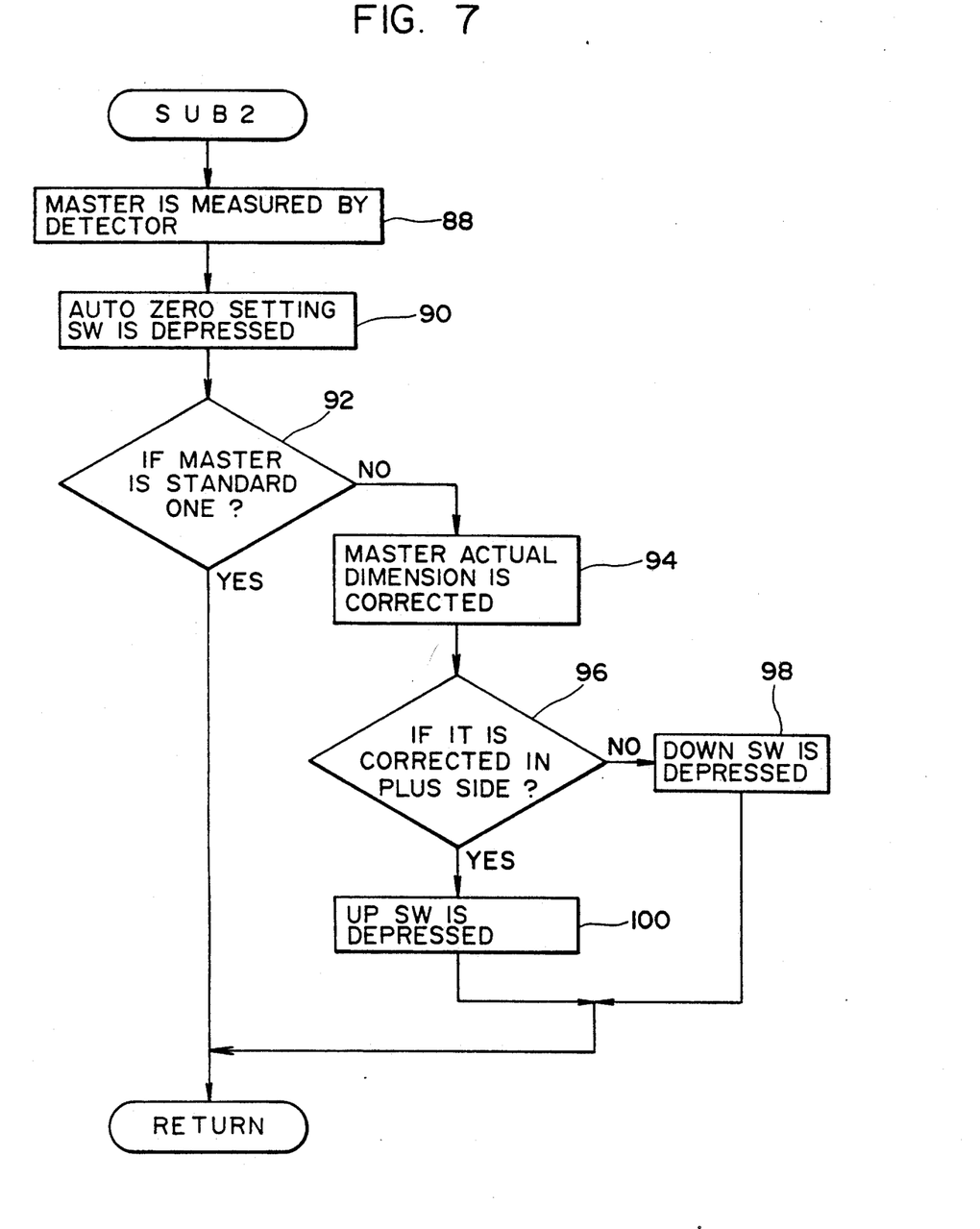
Figure 8:
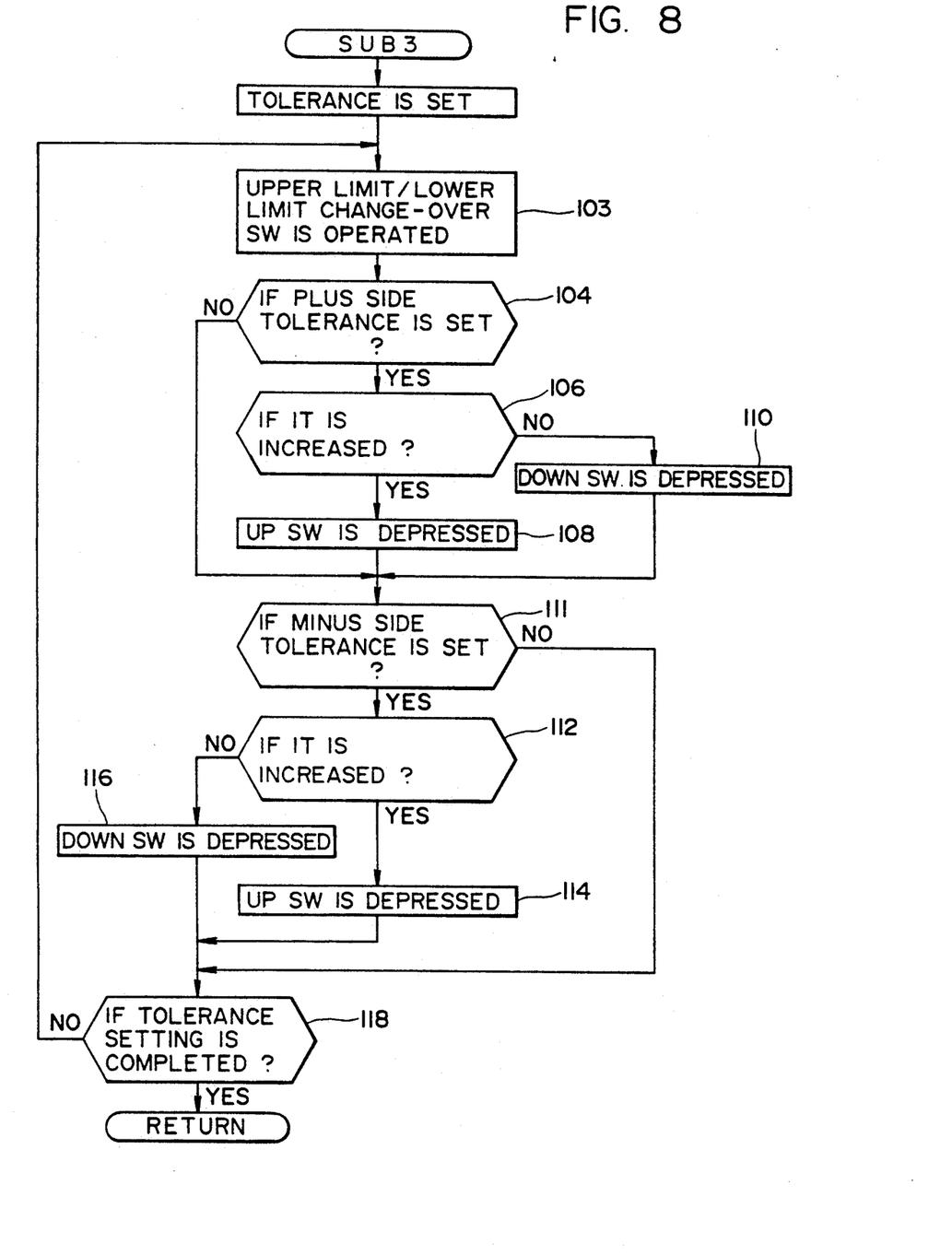
Figure 10C:
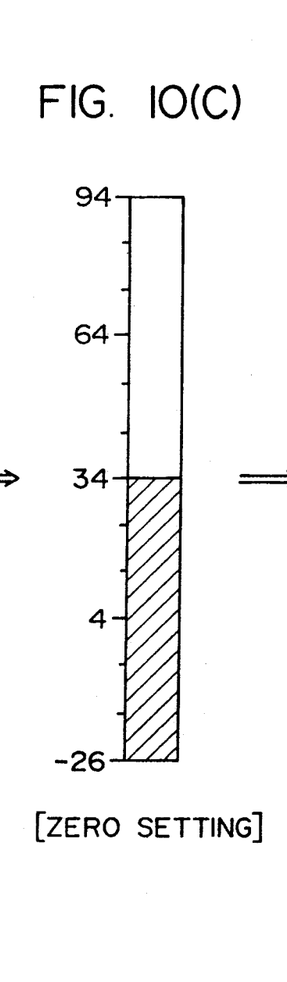
Figure 10D:
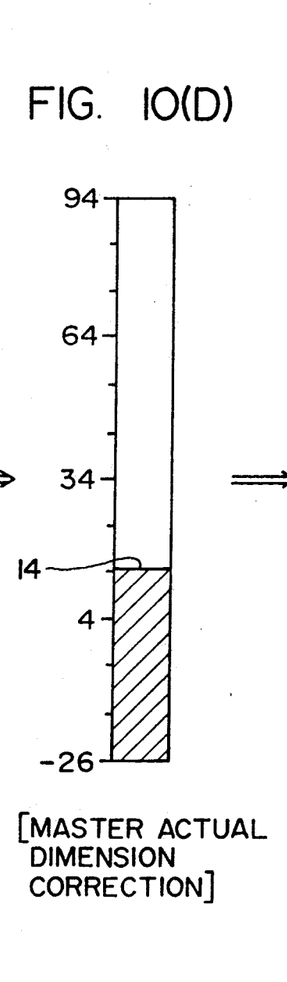

If the setting of the measuring range is executed in this manner, then whether a zero setting process is to be performed is decided in Step 86, and the zero setting process is performed in accordance with a sub-routine 2 shown in FIG. 7. In particular, in Step 88, a master is measured by means of the detector 58. In this case, if a zero setting switch 98 is then turned on in Step 90, then the value of the measured master provides, the center position of the bar graph display part 16. That is, in the illustrated embodiment, 34 μm is provided as the center position resulting from the operation of the zero setting circuit 65 and operation circuit 66 (FIG. 10(C)). For this reason, when the master value is the tolerance center value of 30.034 μm, then the program is allowed to move to the next operation without any further processing. However, when the master value is other than the tolerance center value, that is, 30.014 μm, then the actual master dimension correction is necessary. That is, if it is decided in Step 92 that the master is not the standard value, then the actual master dimension correction is performed in Step 94. In this case, while the master value is 130.014 μm, it is displayed as 34 μm in the bar graph display part 16. Therefore, 20 μm must be subtracted from the value displayed. Accordingly, in Step 96 it is checked whether the correction is to be made in the plus side or not. In this case, because the correction is in the minus side, in Step 98, the down switch 26 is pressed down by 20 μm so that 14 μm can be displayed as the master value in the bar graph display part 16 (FIG. 10(D)). Also, when the master value is smaller than the standard value, then the up switch 24 is depressed in Step 100 to thereby execute the plus side correction.

Figure 5:
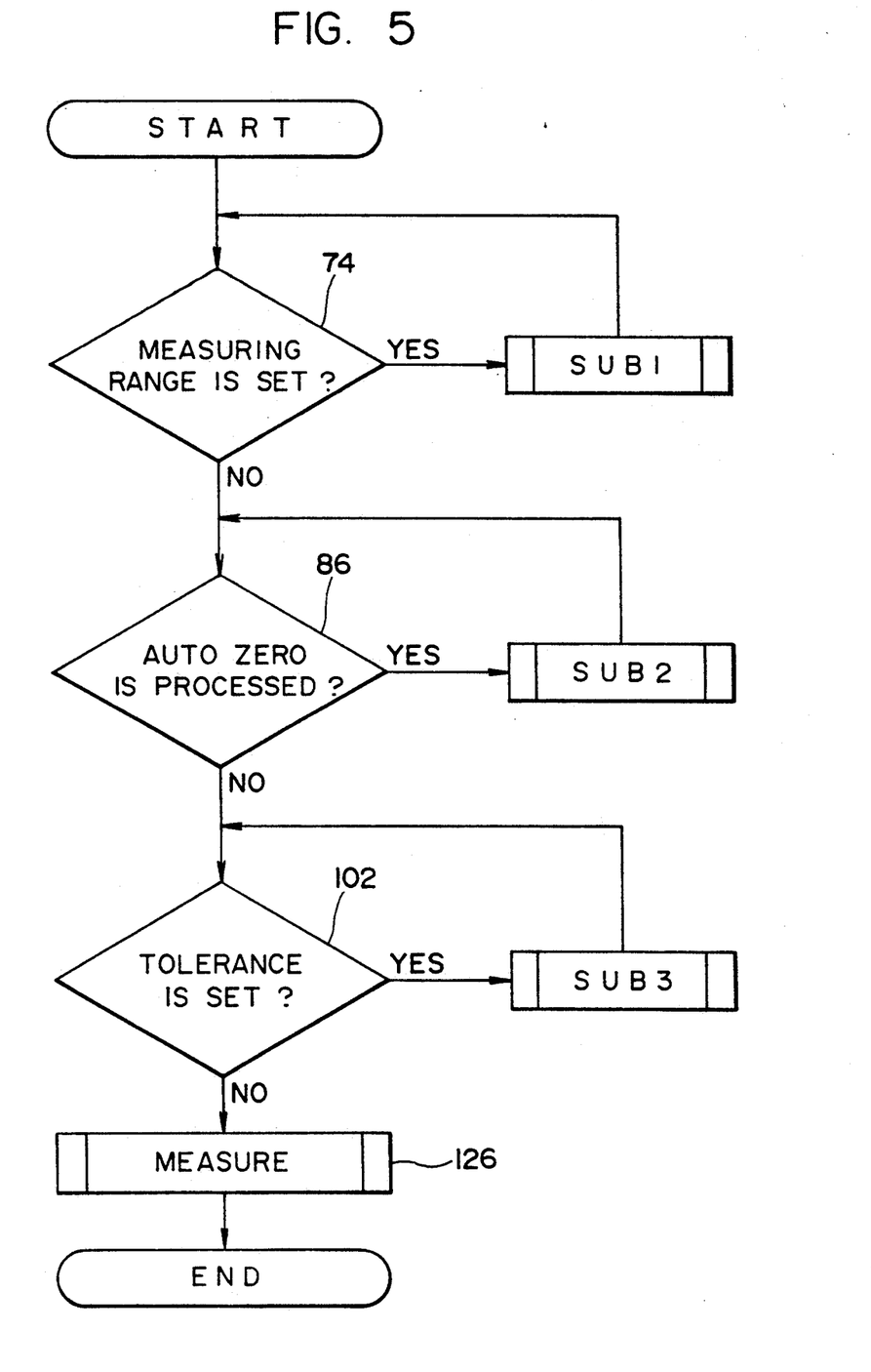
FIGS. 5 to 9 are flow charts respectively showing how to use a column gage according to the present invention.
Figure 6:
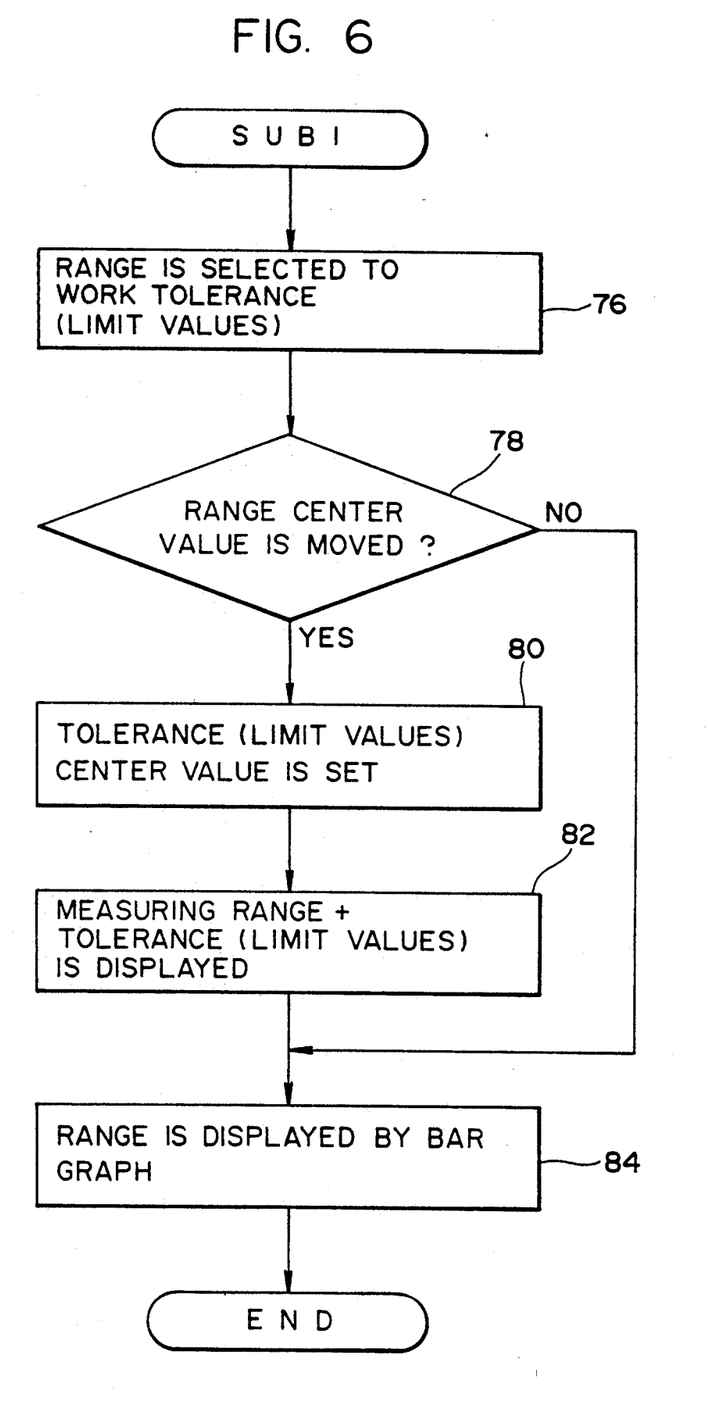

Next, in Step 102 in FIG. 5, whether the tolerance setting is necessary is checked. If the tolerance setting is necessary, then the tolerance is set in accordance with a sub-routine 3 which is shown in FIG. 3. That is, at first, the upper limit value or lower limit value of the tolerance to be set is selected by means of the operation of the change-over switch (Step 103). Next, whether the tolerance set is in the plus or minus side, is checked (Step 104). And, if the tolerance is in the plus, then in Step 106 whether the tolerance to be set must be increased with respect to the previous value is checked. If the tolerance must be increased, then the up switch 24 is operated, as shown in Step 108. And, if it must be decreased, then the down switch 26 is operated to thereby decrease the tolerance value in Step 110. On the other hand, when the tolerance setting in the plus side is not necessary or the tolerance setting is finished, then whether the tolerance setting in the minus side is necessary is checked (Step 111). If it is found that the tolerance setting in the minus side is to be performed, then whether the tolerance to be set must be increased is checked in Step 102. If it is found that the tolerance must be increased, then the up switch 24 is operated in Step 114 and, if it must be decreased, then the down switch 26 is pressed down in Step 116. Next, whether the tolerance setting is finished is checked (Step 118). If it is found not finished, then the program moves back to Step 103 and, if it is finished, then the program goes back to the main routine.

Figure 10E:
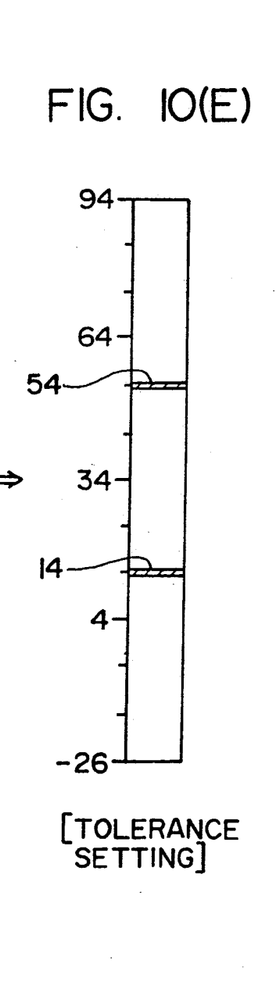

Here, by means of the above-mentioned operation, the upper limit value (+54) and the lower limit value (+14) are not displayed (FIG. 10(E)). When the upper and lower limit values are displayed synchronously with the turning on of the bar graph, then the limit values are displayed in orange and, when they are displayed not synchronously with the bar graph, then they are displayed in red.

Figure 9:
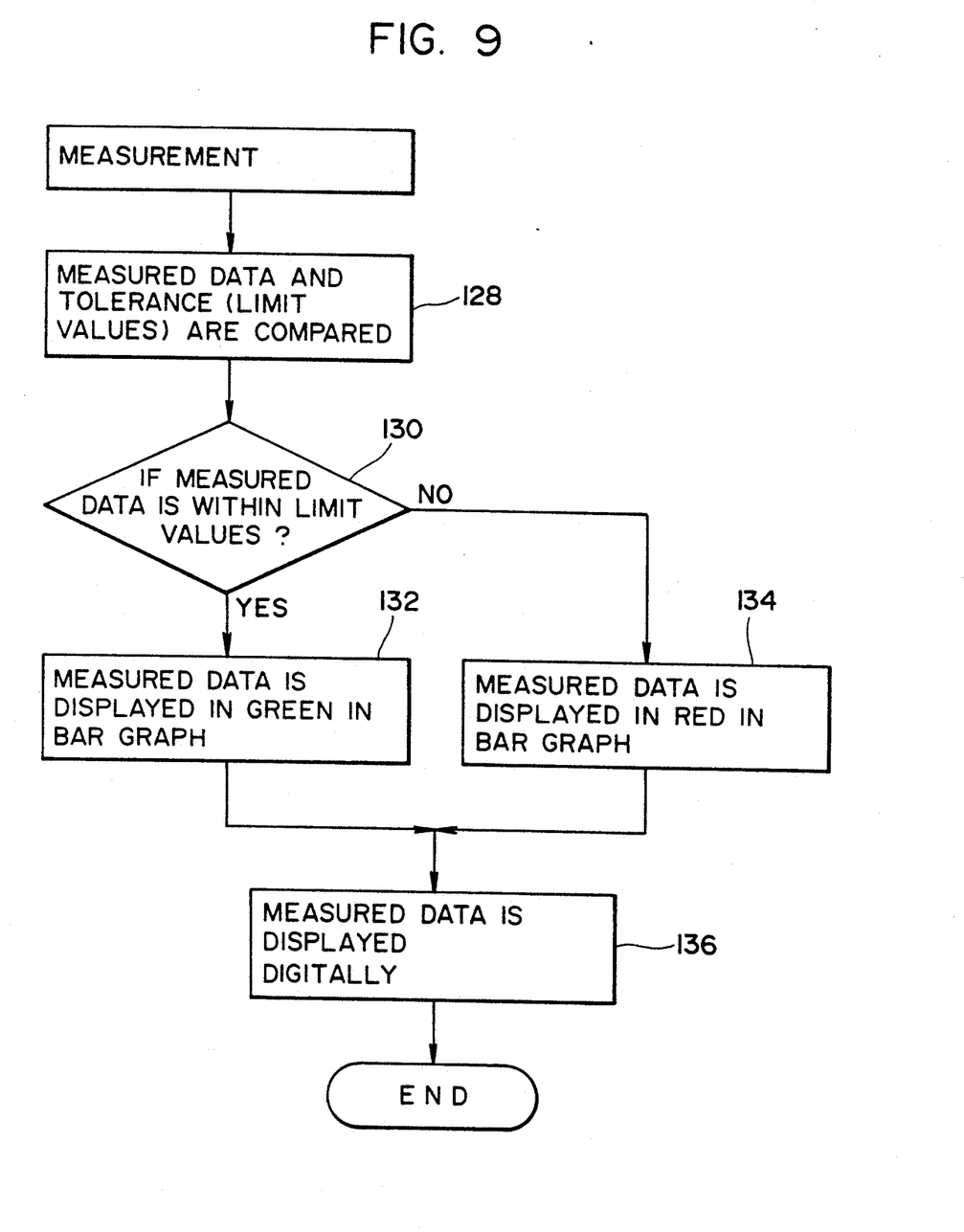

After the tolerance setting is finished in this manner, if the tolerance-setting/measuring change-over switch 20 is changed over to the measuring side thereof, then measurement is carried out as shown in Step 126 in FIG. 5. The flow of the measurement is shown in FIG. 9. As shown in Step 128 in FIG. 9, the measurement data is compared with the tolerance (the limit values thereof). In other words, as shown in Step 130, it is checked whether the measurement data is within the limit values of the tolerance, namely, the allowed tolerance range of +14 ~ +54 μm. If the data is found within the tolerance range, then the measurement value is displayed in green in the bar graph, as shown in Step 132. Also, if the data is found out of the tolerance range in Step 130, then the measurement value is displayed in red in the bar graph, as shown in Step 134. Further, as shown in Step 136, the measurement value is digitally displayed in the display section F.

Although the LEDs are employed as the respective display elements of the bar graph display part in the illustrated embodiment, this is not always limitative and other display elements such as liquid crystal display elements may be used.

As has been described hereinbefore, according to a dimension display device constructed in accordance with the present invention, due to the fact that the center of the allowed tolerance range is set in the center of the bar graph display part, even when the limit values of the allowed tolerance are not situated at different-direction but equal-distance positions with zero between them, the allowed tolerance can always be displayed evenly upwardly and downwardly with the center of the bar graph display part as the center thereof. As a result of this, it is possible to improve the magnification of the range setting for more accurate measurements.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A dimension display device comprising:
   bar graph means including a plurality of display elements to be controlled in accordance with dimensional information of a member to be measured;
   a plurality of scale display means for displaying a plurality of scales in the form of numeric values, said plurality of scale display means respectively located at such positions along said bar graph display means so as to divide said bar graph display means into equally spaced distances, said plurality of scale display means having a center scale display means located at a center position of said bar graph display means;
   numeric value data output means for outputting a plurality of numeric value data in such a manner that numeric values corresponding to respective positions of said plurality of scale display means are displayed in said plurality of scale display means, wherein a zero value is displayed in said center scale display means;
   tolerance center value setting means for setting a center value of an allowed tolerance of a member to be measured and for outputting numeric value data indicating said center value;
   adding means for adding said numeric value data output from said tolerance center value setting means to said numeric value data output from said numeric value data output means, respectively;
   scale display control means for allowing said plurality of scale display means to display numeric values in accordance with the numeric value data output from said adding means; and
   range setting means for setting a measuring range displayed by said bar graph display means, wherein said numeric value data output means outputs numeric value data so that the numeric values corresponding to the respective positions of said plurality of scale display means can be displayed in accordance with the measuring range set by said range setting means.

2. A dimension display device as set forth in claim 1, comprising:
   a zero setting switch for setting the zero value in the center of said bar graph display means;
   an actual master dimension correction switch for switching to a correction mode to correct an actual master dimension value;

memory means for storing as a reference value a measurement value input from the measuring means when said zero setting switch is on;

correction means for outputting a correction value to correct said stored reference value by means of the switching operation of said actual master dimension correction switch;

difference determining means for determining a difference between a measurement value input from said measuring means and the reference value corrected by said correction value;

converting means for converting an operation value output from said difference determining means to a value inversely proportional to a size of a measuring range set by said range setting means; and, bar graph display control means for controlling the actuation of said plurality of display elements of said bar graph display means in accordance with the value output from said converting means, and for controlling said plurality of display elements such that, when said value is zero, the display element situated at the center of said bar graph display means and all of the display elements situated below said center display element can be turned on.

3. A dimension display device as set forth in claim 2, further comprising:

tolerance setting means for setting upper and lower limit values of a tolerance range of a member to be measured; and means for turning on the display elements of said bar graph display means corresponding to said upper and lower limit values set by said tolerance setting means, wherein said means for turning on the display elements turns on the display elements corresponding to said upper and lower tolerance limit values in a color that is different from other display elements.

4. A dimension display device as set forth in claim 3, further comprising:

decision making means for comparing an operation value output from said converting means with upper and lower tolerance limit values set by said tolerance setting means, wherein said decision making means decides whether said difference value is between said upper and lower tolerance limit values; and, means for changing the color of said display elements of said bar graph display means in accordance with outputs from said decision means.

5. A dimension display device comprising:

bar graph display means including a plurality of display elements to be controlled in accordance with dimensional information of a member to be measured;

a plurality of scale display means for displaying a plurality of scales in the form of numeric values, said plurality of scale display means respectively located at such positions along said bar graph display means so as to divide said bar graph display means into equally spaced distances, said plurality of scale display means having a center scale display means located at a center position of said bar graph display means;

numeric value data output means for outputting a plurality of numeric value data in such a manner that numeric values corresponding to respective positions of said plurality of scale display means are displayed in said plurality of scale display means, wherein a zero value is displayed in said center scale display means;

tolerance center value setting means for setting a center value of an allowed tolerance of a member to be measured and for outputting numeric value data indicating said center value;

adding means for adding said numeric value data output from said tolerance center value setting means to said numeric value data output from said numeric value data output means, respectively;

scale display control means for allowing said plurality of scale display means to display numeric values in accordance with the numeric value data output from said adding means;

a zero setting switch for setting the zero value in the center of said bar graph display means;

an actual master dimension correction switch for switching to a correction mode to correct an actual master dimension value;

memory means for storing as a reference value a measurement value input from a measuring means, wherein the measuring means measures a master of an object to be measured having desired physical dimensions when said zero setting switch is on;

corrections means for outputting a correction value to correct said stored reference value by means of the switching operation of said actual master dimension correction switch;

difference determining means for determining a difference between said measurement value input from the measuring means and the reference value corrected by said correction value, wherein said difference determining means outputs a value corresponding to the determined difference; and bar graph display control means for controlling the actuation of said plurality of display elements of said bar graph display means in accordance with a difference value output from said difference determining means, and for controlling said display elements such that, when said difference value is zero, the display element situated at the center of said bar graph display means and all of the display elements situated below said center display elements are turned on.

* * * * *